(12) United States Patent
Lee et al.

(10) Patent No.: US 9,006,772 B2
(45) Date of Patent: Apr. 14, 2015

(54) ORGANIC LIGHT EMITTING DIODE LIGHTING APPARATUS

(75) Inventors: Jae-Goo Lee, Yongin (KR); Doo-Hwan Kim, Yongin (KR); Min-Woo Lee, Yongin (KR); Sung-Jin Choi, Yongin (KR); Young-Mo Koo, Yongin (KR)

(73) Assignee: Samsung Display Co., Ltd. (KR)

(*) Notice: Subject to any disclaimer, the term of this patent is extended or adjusted under 35 U.S.C. 154(b) by 88 days.

(21) Appl. No.: 13/429,783

(22) Filed: Mar. 26, 2012

(65) Prior Publication Data
US 2012/0261710 A1 Oct. 18, 2012

(30) Foreign Application Priority Data
Apr. 18, 2011 (KR) .................. 10-2011-0035833

(51) Int. Cl.
| | |
|---|---|
| H01L 33/00 | (2010.01) |
| H01L 51/40 | (2006.01) |
| F21V 5/00 | (2006.01) |
| H01L 29/08 | (2006.01) |
| H01L 27/15 | (2006.01) |
| H01L 29/267 | (2006.01) |
| H01L 51/52 | (2006.01) |

(52) U.S. Cl.
CPC ........ *H01L 51/5237* (2013.01); *H01L 51/5203* (2013.01); *H01L 2251/5361* (2013.01)

(58) Field of Classification Search
CPC ............... H01L 29/66969; H01L 29/78648; H01L 51/0001; H01L 51/0015; H01L 51/0017; H01L 51/0021; H01L 51/5036; H01L 51/5048; H01L 51/5281; H01L 2051/0063; H01L 2251/566; H01L 2251/568; H01L 27/3288; H01L 27/3293; H01L 51/002; H01L 51/0046
USPC ........ 257/40, 59, 72, 79–103; 438/17, 34, 26, 438/48, 128, 99; 313/397, 495, 507, 503, 313/504, 512, 112, 234, 498, 506, 582, 313/607; 361/667, 671, 679.21, 679.24; 362/228, 330, 611, 612, 613, 97.1, 362/97.2
See application file for complete search history.

(56) References Cited

U.S. PATENT DOCUMENTS

| | | | |
|---|---|---|---|
| 2009/0256471 A1* | 10/2009 | Kim et al. ............. | 313/504 |
| 2010/0157585 A1* | 6/2010 | Diekmann et al. ...... | 362/228 |
| 2010/0176385 A1* | 7/2010 | Lifka et al. ........... | 257/40 |

FOREIGN PATENT DOCUMENTS

| | | |
|---|---|---|
| JP | 2009-054524 | 3/2009 |
| KR | 10-2002-0031759 | 5/2002 |
| KR | 10-2007-0121183 | 12/2007 |

* cited by examiner

*Primary Examiner* — Colleen A Matthews
*Assistant Examiner* — Junaiden Mirsalahuddin
(74) *Attorney, Agent, or Firm* — Knobbe Martens Olson & Bear LLP

(57) ABSTRACT

An organic light emitting diode (OLED) lighting apparatus includes a light emitting panel including an organic light emitting diode, a housing for housing the light emitting panel, a cover coupled to the housing and covering a front-side edge of the light emitting panel, a plurality of pins disposed between the housing and the light emitting panel and supporting an edge of the light emitting panel, and at least one contact bar disposed between the plurality of pins and a back-side edge of the light emitting panel.

6 Claims, 5 Drawing Sheets

US 9,006,772 B2

ORGANIC LIGHT EMITTING DIODE LIGHTING APPARATUS

CROSS-REFERENCE TO RELATED APPLICATIONS

This application claims priority to and the benefit of Korean Patent Application No. 10-2011-0035833 filed in the Korean Intellectual Property Office on Apr. 18, 2011, the entire contents of which are incorporated herein by reference.

BACKGROUND

1. Field

The described technology relates generally to a lighting apparatus. More particularly, the described technology relates generally to an organic light emitting diode lighting apparatus using an organic light emitting diode (OLED).

2. Description of the Related Technology

An organic light emitting diode (OLED) lighting apparatus is a lighting apparatus using organic light emitting diodes (OLED) as the source of light. The OLED emits light using energy that is generated when excitons are dropped from an excited state to a ground state after the excitons are formed by coupling electrons and holes in an organic emission layer.

The OLED lighting apparatus may generate light which is similar to the light generated from a surface light source. Luminance deviation, however, may be generated in the OLED lighting apparatus due to a non-uniform current supply. Such a luminance deviation problem may become more serious as the OLED lighting apparatus becomes larger in area.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology provides an organic light emitting diode (OLED) lighting apparatus having an advantage of minimizing luminance deviation.

One embodiment provides an organic light emitting diode (OLED) lighting apparatus including a light emitting panel including an organic light emitting diode, a housing for housing the light emitting panel, a cover coupled to the housing and covering a front-side edge of the light emitting panel, a plurality of pins disposed between the housing and the light emitting panel and supporting an edge of the light emitting panel, and at least one contact bar disposed between the plurality of pins and a back-side edge of the light emitting panel.

The contact bar may make one a line contact or a surface contact with a back-side edge of the light emitting panel.

An electrode pad may be formed at the back-side edge of the light emitting panel.

The contact bar may be formed in a semi-cylindrical shape.

The light emitting panel may contact a convex part of the contact bar.

The plurality of pins may contact a concave part of the contact bar.

The plurality of pins and the contact bar may transfer an electric current to the light emitting panel.

The plurality of pins may have elasticity.

According to one embodiment, the organic light emitting diode lighting apparatus can minimize luminance deviation.

DETAILED DESCRIPTION OF CERTAIN INVENTIVE EMBODIMENTS

Figure 1:
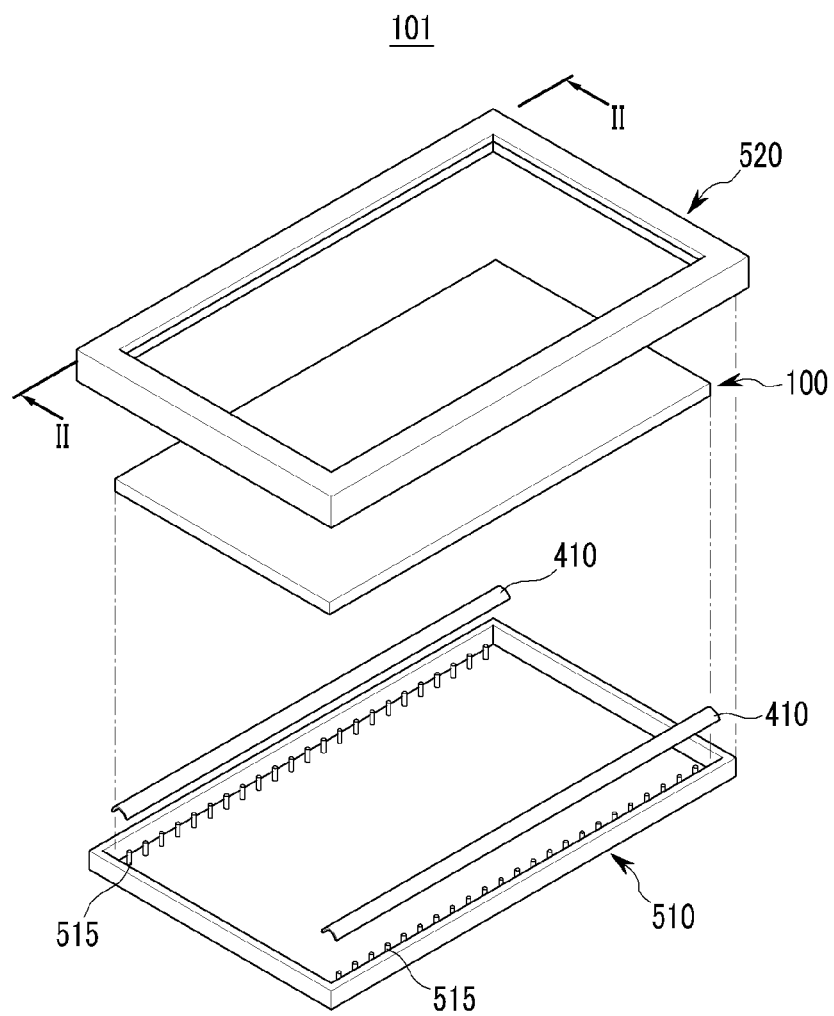
FIG. 1 is an exploded perspective view of an embodiment of an organic light emitting diode (OLED) lighting apparatus.

In the following detailed description, certain embodiments have been shown and described, simply by way of illustration. As those skilled in the art would realize, the described embodiments may be modified in various ways, without departing from the spirit or scope of the present invention.

Throughout the specification, the same or similar constituent elements are generally designated by the same reference numerals.

In the drawings, the size and thickness of each element is approximately shown for better understanding and ease of description. Therefore, the present invention should not be limited to the drawings. In the drawings, the thickness of layers, films, panels, regions, etc., may be exaggerated for clarity. Further, in the drawings, the thickness of layers and regions may be exaggerated for better understanding and ease of description. It will be understood that when an element such as a layer, film, region, or substrate is referred to as being "on" another element, it can be directly on the other element or intervening elements may also be present.

Hereinafter, an embodiment of an organic light emitting diode (OLED) lighting apparatus will be described with reference to FIGS. 1 and 2.

Figure 2:
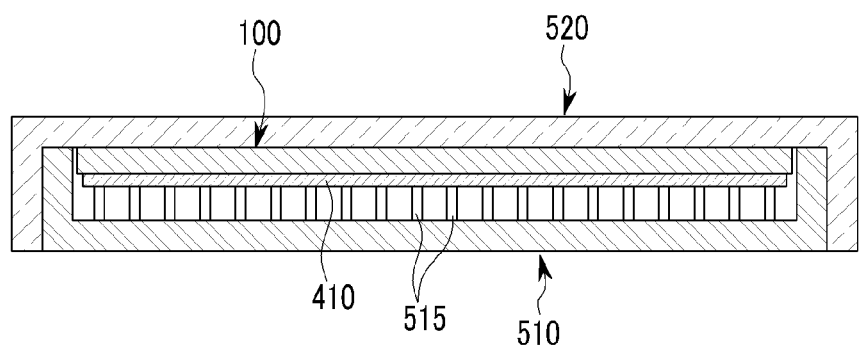
FIG. 2 is a cross-sectional view of FIG. 1 taken along the line II-II.

As shown in FIGS. 1 and 2, an embodiment of the OLED lighting apparatus 101 includes a light emitting panel 100, a housing 510, a cover 520, a plurality of pins 515, and at least one contact bar 410.

Figure 3:
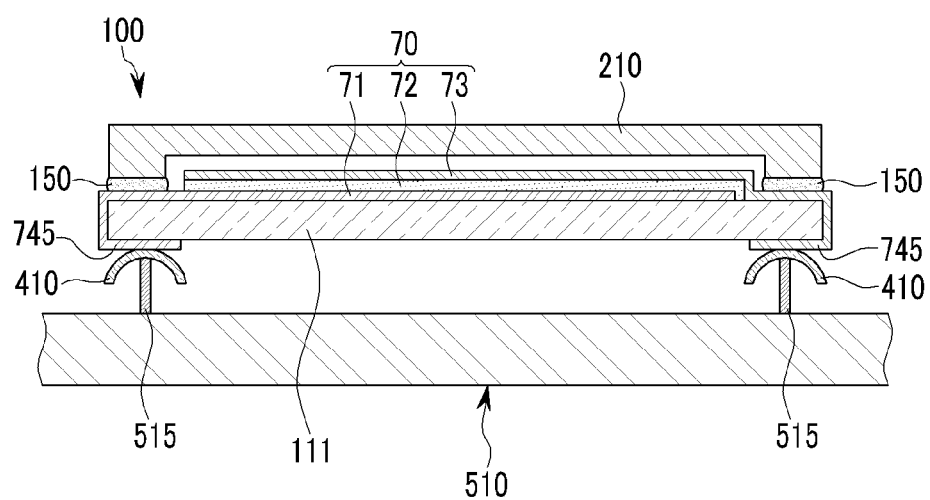
FIG. 3 is a cross-sectional view that illustrates an embodiment of a light emitting panel in the embodiment of an OLED lighting apparatus of FIG. 1.

The light emitting panel 100 includes an organic light emitting diode 70 shown in FIG. 3. The light emitting panel 100 emits light using the organic light emitting diode 70. The housing 510 houses and supports the light emitting panel 100. The cover 520 is coupled with the housing 510 and covers a front edge of the light emitting panel 100.

A plurality of pins 515 are disposed between the housing 510 and the light emitting panel 100, and support the edge of the light emitting panel 100. The plurality of pins 515 transfer an electric current to the light emitting panel 100.

The plurality of pins 515 may have elasticity. In some embodiments, pins 515 may be formed as pin springs. Accordingly, the plurality of pins 515 stably support the light emitting panel 100 by relieving impact applied to the light emitting panel 100. Embodiments of the OLED lighting apparatus 101 thereby have improved crashworthiness.

In FIG. 1, the plurality of pins 515 are disposed at both edges of the light emitting panel 100, which face each other. In other embodiments, the plurality of pins 515 may be disposed at all edges of the light emitting panel 100.

The contact bar 410 is disposed between the plurality of pins 515 and a back-side edge of the light emitting panel 100. The contact bar 410 is formed in a semi-cylindrical shape. A convex part of the contact bar 410 contacts the light emitting panel 100, and a concave part of the contact bar 410 contacts the plurality of pins 515. The contact bar 410 makes line contact or surface contact with the back-side edge of the light emitting panel 100. Accordingly, the contact bar 410 uniformly transfers an electric to the edge of the light emitting panel 100.

Since the plurality of pins 515 contact the concave part of the contact bar 410, the plurality of pins 515 and the contact bar 410 are prevented from being misarranged. Furthermore, since the light emitting panel 100 contacts the convex part of the contact bar 410, the contact bar 410 can more easily make line contact or the surface contact with the light emitting panel 100. Accordingly, an electric current can be stably and uniformly transferred to the light emitting panel 100 through the contact bar 410.

In FIG. 1, a pair of contact bars 410 are shown. In other embodiments, one, or more than two contact bars 410 may be used according to locations of the plurality of pins 515.

As described above, embodiments of the OLED lighting apparatus 101 can minimize luminance deviation throughout the light emitting panel 100. Furthermore, the OLED lighting apparatus 101 may have improved crashworthiness.

Hereinafter, the light emitting panel 100 contacting the contact bar 410 will be described in detail with reference to FIG. 3.

As shown in FIG. 3, the light emitting panel 100 includes a substrate main body 111, an organic light emitting diode 70, a sealant 150, and an encapsulation substrate 210. The light emitting panel 100 further includes an electrode pad 745 formed at a back-side edge and connected to the OLED 70.

The substrate main body 111 may be made of glass, quartz, ceramic, and the like, or may be a plastic substrate made of a material such as acryl, polyimide, polyaniline, and the like.

The substrate main body 111 is divided into a light emitting area, and a sealing area surrounding the light emitting area. The OLED 70 is disposed in the light emitting area, and the sealant 150 is disposed in the sealing area.

The OLED 70 includes a first electrode 71 disposed on the substrate main body 111, an organic emission layer 72 disposed on the first electrode 71, and a second electrode 73 disposed on the organic emission layer 72.

In some embodiments, the first electrode 71 is an electron-injection electrode that injects electrons into the organic emission layer 72. The second electrode 73 is a hole-injection electrode that injects holes into the organic emission layer 72. In other embodiments, the first electrode 71 may be a hole-injection electrode, and the second electrode 73 may be an electron-injection electrode.

The first electrode 71 is formed as a reflective layer, and the second electrode 73 is formed as a transparent conductive layer or a semi-transparent layer.

The transparent conductive layer may be include at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO). Such a transparent conductive layer has a comparatively high work function. The second electrode 73 formed as the transparent conductive layer can smoothly perform hole injection. When the second electrode 73 is formed as the transparent conductive layer, the light emitting panel 100 may further include an auxiliary electrode made of a metal having comparatively low resistivity in order to compensate for the comparatively high resistivity of the second electrode 73.

The reflective layer and the semi-transparent layer may be made of a metal such as magnesium (Mg), calcium (Ca), lithium (Li), zinc (Zn), aluminum (Al), or alloys thereof. The reflective layer and the semi-transparent layer are determined by thickness. In general, the semi-transparent layer has a thickness that is less than about 200 nm. The light transmittance of the semi-transparent layer increases as the semi-transparent layer becomes thinner and decreases as it becomes thicker.

In some embodiments, the reflective layer and the semi-transparent layer are the first electrode 71, which is the electron-injection electrode. Accordingly, the reflective layer and the semi-transparent layer may be made of a metal having a comparatively lower work function, for example lower than about 4.5 eV.

When the second electrode 73 is formed as a semi-transparent electrode, and the first electrode 71 is formed as a reflective layer, light use efficiency can be improved due the microcavity effect.

The second electrode 73 may be formed as a multilayer structure including a transparent conductive layer and a semi-transparent layer. In such embodiments, the microcavity effect can be achieved since the second electrode 73 has a comparatively high work function.

The organic emission layer 72 may be formed as a multilayer including at least one of an emission layer, a hole-injection layer (HIL), a hole-transporting layer (HTL), an electron-transporting layer (ETL), and electron-injection layer (EIL). The above layers except the emission layer may be omitted as needed in various embodiments. In embodiments where the organic emission layer 72 includes all of the described layers, the hole-injection layer (HIL) is disposed on the first electrode 71, which is a hole-injection electrode. The hole-transporting layer (HTL), the emission layer, electron-transporting layer (ETL), and the electron-injection layer (EIL) are sequentially stacked on the hole-injection layer (HIL).

The organic emission layer 72 may further include other layers as needed. In some embodiments, the organic emission layer 72 may further include a resonance layer for maximizing the microcavity effect.

The sealant 150 is formed on the sealing area of the substrate main body 111. The sealant 150 may be made of frit or a thermosetting resin.

The encapsulation substrate 210 is sealed with the substrate main body 111 through the sealant 150, thereby covering the organic light emitting diode 70. The encapsulation substrate 210 is a glass substrate or a plastic substrate such as acryl, polyimide, and polyaniline.

In embodiments where the substrate main body 111 and the encapsulation substrate 210 are made of the plastic substrate, the light emitting panel 100 may have flexibility.

The encapsulation substrate 210 has a sunken portion corresponding to the light emitting area of the substrate main body 111 whereon the OLED 70 is formed. Therefore, the encapsulation substrate 210 is stably separated from the organic light emitting diode 70 while the encapsulation substrate 210 is sealed with the substrate main body 111 through the sealant 150. Accordingly, the encapsulation substrate 210 protects the organic light emitting element 70 from damage.

The electrode pad 745 is formed at a back-side edge of the substrate main body 111 and contacts the connector bar 410. The electrode pad 745 receives an electric current through the plurality of pins 515 and the connector bar 410, and transfers the electric current to the organic light emitting diode 70.

Embodiments of the light emitting panel 100 are not limited to the structure show in FIG. 3. The light emitting panel 100 may have various structures that are well-known to those skilled in the art.

Hereinafter, an experimental example according to an embodiment will be compared with a comparative example with reference to FIG. 4 and FIG. 5, and Table 1 and Table 2 below.

TABLE 1

Figure 4:
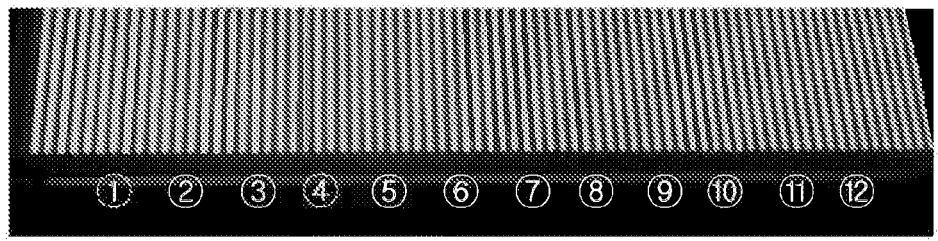
FIG. 4 and FIG. 5 demonstrate a comparison between an embodiment with a comparative example.

| | Position on FIG. 4 | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Luminance cd/m² | 1820 | 1885 | 1836 | 1845 | 1788 | 1822 | 1853 | 1814 | 1842 | 1824 | 1791 | 1822 |

TABLE 2

Figure 5:
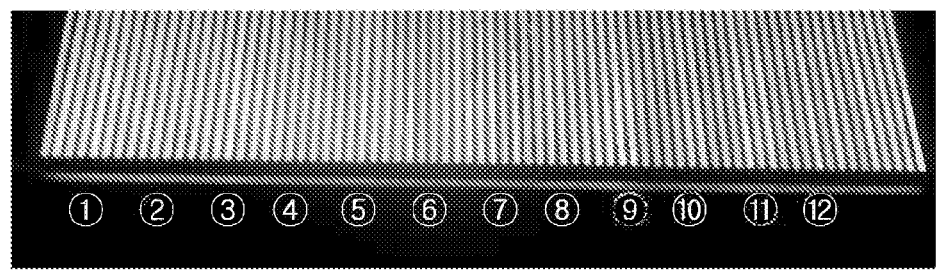

| | Position on FIG. 5 | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Luminance cd/m² | 2022 | 1735 | 2013 | 1650 | 1988 | 1598 | 2016 | 1621 | 1955 | 1567 | 2010 | 1721 |

The experimental example includes the contact bar 410. The comparative example includes a plurality of pins 515 directly contacting a light emitting panel 100 without a contact bar 410.

FIG. 4 is a picture illustrating luminance distribution of the experimental example. FIG. 5 is a picture illustrating luminance distribution of the comparative example. Table 1 shows luminance values measured at positions assigned with numbers shown in FIG. 4. Table 2 shows luminance values measured at positions assigned with numbers shown in FIG. 5.

As shown in FIG. 4 and Table 1, luminance is uniformly distributed in the experimental example. The luminance deviation is about 5%.

On the contrary, as shown in FIG. 5 and Table 2, luminance distribution is comparatively non-uniform in the comparative example. The luminance deviation is about 25%.

As described above, the experimental example has luminance distribution that is more uniform than that of the comparative example.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

70: organic light emitting diode
71: first electrode
72: organic emission layer
73: second electrode
100: light emitting panel
101: organic light emitting diode lighting apparatus
111: substrate main body
150: sealant
210: encapsulation substrate
410: contact bar
510: housing
515: pin
520: cover
745: electrode pad

What is claimed is:

1. An organic light emitting diode (OLED) lighting apparatus comprising:
    a light emitting panel including a substrate and an organic light emitting diode on the substrate, the organic light emitting diode including a first electrode, an organic emission layer disposed on the first electrode, and a second electrode disposed on the organic emission layer;
    a housing for housing the light emitting panel;
    a cover coupled to the housing and covering a front-side edge of the light emitting panel;
    a plurality of pin springs disposed between the housing and the light emitting panel and supporting an edge of the light emitting panel;
    at least one contact bar disposed between the plurality of pin springs and a back-side edge of the substrate; and
    an electrode pad formed at a back-side edge of the substrate, extended from at least one of the first electrode or the second electrode, and contacting the contact bar.

2. The OLED lighting apparatus of claim 1, wherein the contact bar makes at least one of a line contact and a surface contact with a back-side edge of the substrate.

3. The OLED lighting apparatus of claim 1, wherein the contact bar is formed in a semi-cylindrical shape.

4. The OLED lighting apparatus of claim 3, wherein the electrode pad contacts a convex part of the contact bar.

5. The OLED lighting apparatus of claim 3, wherein the plurality of pin springs contact a concave part of the contact bar.

6. The OLED lighting apparatus of claim 1, wherein the plurality of pin springs and the contact bar transfer an electric current to the light emitting panel.

* * * * *